US006885066B2

United States Patent
Miura (10) Patent No.: US 6,885,066 B2
(45) Date of Patent: Apr. 26, 2005

(54) SOI TYPE MOSFET (75) Inventor: Noriyuki Miura, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/730,094

(22) Filed: Dec. 9, 2003

(65) Prior Publication Data
US 2005/0040464 A1 Feb. 24, 2005

(30) Foreign Application Priority Data
Aug. 20, 2003 (JP) .................................. 2003-296573

(51) Int. Cl.$^7$ .............................................. H01L 27/01
(52) U.S. Cl. .................. 257/347; 257/349; 257/344; 257/327; 438/149; 438/151; 438/162; 438/278; 438/311; 438/479
(58) Field of Search ................................ 257/347, 349, 257/344, 345, 327; 438/149, 151, 162, 163, 298, 311, 479

(56) References Cited
U.S. PATENT DOCUMENTS 5,965,918 A * 10/1999 Ono ............................ 257/347
6,093,592 A 7/2000 Nakabayashi et al. ...... 438/221
6,452,232 B1 * 9/2002 Adan .......................... 257/347

FOREIGN PATENT DOCUMENTS

| JP | 63-313865 | 12/1988 |
| JP | 07-211902 | 8/1995 |
| JP | 08-051198 | 2/1996 |
| JP | 2001-135821 | 5/2001 |
| JP | 2001230394 A * | 8/2001 |

OTHER PUBLICATIONS

Lisa T. Su et al., "Optimization of Series Resistance in Sub–0.2 $\mu$m SOI MOSFETs", 1993 IEEE, pp. 723–726.

Neal Kistler et al., "Scaling Behavior of Sub–Micron MOSFETs on Fully Depleted SOI", Solid–State Electronics vol. 39, No. 4, 1996, pp. 445–454.

* cited by examiner

Primary Examiner—Nathan J. Flynn
Assistant Examiner—Remmon R. Fordé
(74) Attorney, Agent, or Firm—Volentine Francos & Whitt PLLC

(57) ABSTRACT

A buried insulating film is formed in an LDD region between a source region and a drain region, and a non-doped silicon film is formed in the SOI layer above the buried insulating film. The SOI layer lying under the buried insulating film has a body concentration of $10^{18}$ cm$^{-3}$.

5 Claims, 12 Drawing Sheets

SOI TYPE MOSFET

BACKGROUND OF THE INVENTION

1. Field of the Invention

The present invention relates to a semiconductor device, and, more particularly, to an MOSFET (Metal-Oxide-Semiconductor Field Effect Transistor) using an SOI (Silicon On Insulator) substrate.

2. Description of the Related Art

An MOSFET formed on a conventional SOI substrate is formed in a process similar to the fabrication process for an MOSFET on an ordinary bulk substrate (Si substrate). For example, there has been proposed a method of forming an MOSFET on an SOI substrate using a process similar to the process for the ordinary bulk substrate (see L. T. Su et al., Proc. IEDM 93, pp. 723–726 (1995)). The outline of the method will be given below referring to FIG. 9.

Figure 9A:
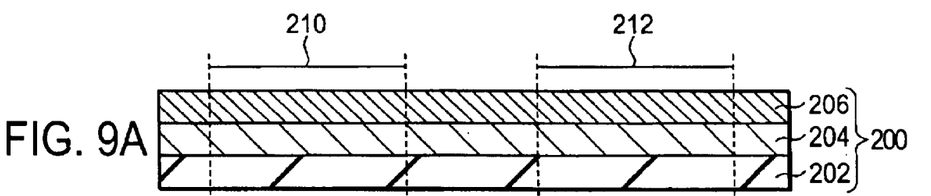
FIGS. 9A to 9F are process diagrams used for explaining a method of fabricating the conventional semiconductor device.

An SOI substrate 200 having a BOX (Buried Oxide) layer 204 and an SOI layer 206 deposited on an Si substrate 202 in order is prepared (FIG. 9A). The BOX layer 204 is a buried silicon oxide film and the SOI layer 206 is a silicon layer formed on the BOX layer.

Figure 9B:
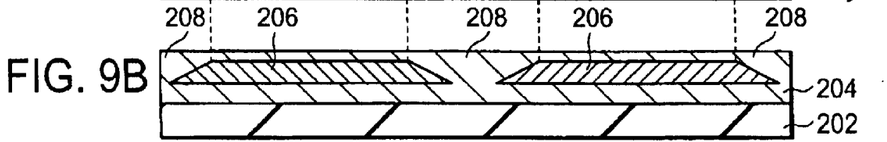

The SOI layer 206 of the SOI substrate 200 is subjected to sacrificed oxidation and the sacrificed-oxidation portion is removed to adjust the thickness of the SOI layer (not shown). An oxide film to be a device isolation region 208 is formed by LOCOS (Local oxidation) or STI (Shallow Trench Isolation). The regions that are surrounded by this device isolation region become an NMOS forming region 210 and a PMOS forming region 212 (FIG. 9B).

Figure 9C:
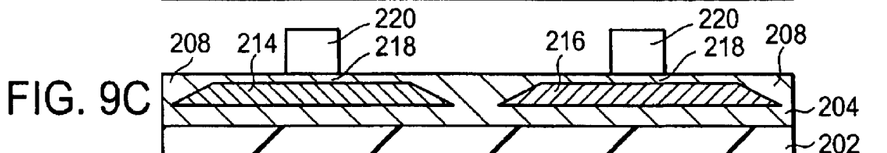

Next, threshold-controlled ion injection is performed on each of the NMOS forming region 210 and the PMOS forming region 212 to form a P well region 214 and an N well region 216. Then, a gate oxide film 218 is formed. The gate oxide film 218 may be formed before the threshold-controlled ion injection. A non-doped polysilicon film is formed on the gate oxide film 218 and is etched using a resist pattern of a desired gate pattern, thereby forming a non-doped silicon film 220 (FIG. 9C).

Figure 9D:
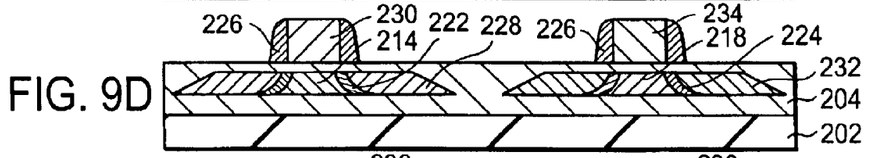

Source-drain ion injection is performed on each of the NMOS forming region 210 and the PMOS forming region 212. As the illustrated example has an LDD (Lightly Doped Drain) structure, an impurity of a low concentration is doped into the NMOS forming region 210 and the PMOS forming region 212 first with a patterned polysilicon film as a mask, thereby forming an n⁻ region 222 and a p⁻ region 224. Then, sidewalls 226 are formed on the sides of the polysilicon film 220 by an insulating film, and with the sidewalls 226 and the polysilicon film 220 as masks, ion injection is performed on the NMOS forming region 210 and the PMOS forming region 212 to form an n⁺ region 228 and a p⁺ region 232 which become source and drain regions. At this time, an impurity is doped into the non-doped silicon film 220 by ion injection, so that an n⁺ polysilicon film 230 which becomes a gate electrode doped with an n type impurity is formed on the NMOS side and a p⁺ polysilicon film 234 which becomes a gate electrode doped with a p type impurity is formed on the PMOS side (FIG. 9D).

Figure 9E:
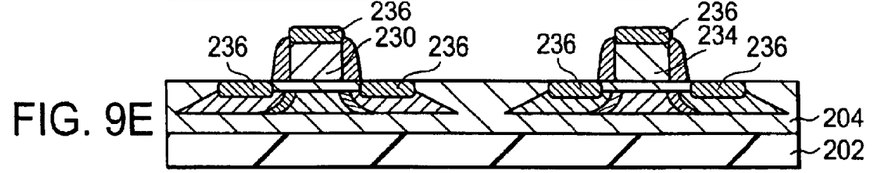

Next, a silicide film 236 is formed to reduce the sheet resistances of the source and drain regions and the gate electrode (FIG. 9E).

Figure 9F:
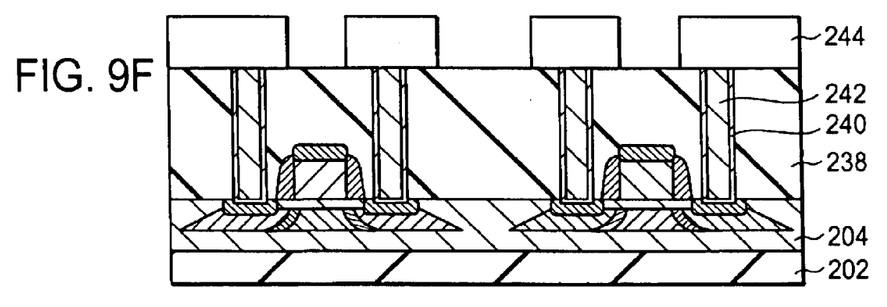

After an interlayer insulating film 238 is deposited, contact holes are formed and barrier metals 240 and contacts 242 are formed in the contact holes. Then, metal wires 244 are formed, thereby yielding an MOSFET (FIG. 9F).

In the SOI transistors fabricated in the above-described process, as the device size becomes smaller, a so-called short channel effect (SCE) in which the threshold voltage ($V_{th}$) falls as the gate length becomes shorter occurs. As the SCE makes a variation in threshold voltage worse, it is important to suppress the SCE.

It is known that making the SOI layer thinner is effective in suppressing the SCE (see N. Kistler et al., Solid State Electronics, vol. 39, No. 4, pp. 445-454 (1996)).

Figure 10:
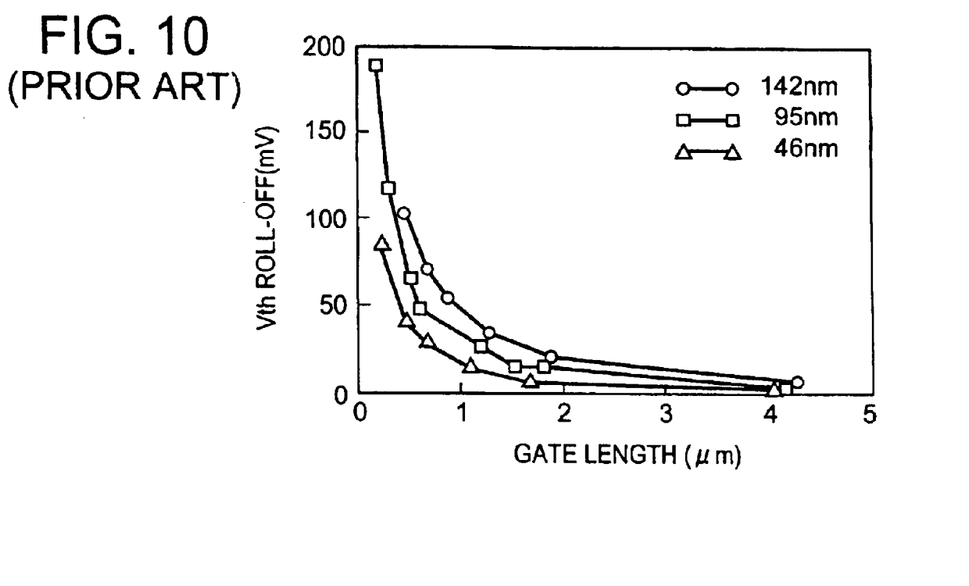
FIG. 10 is a diagram showing the relationship between the gate length and $V_{th}$ roll-off of the conventional semiconductor device.

FIG. 10 is a diagram showing the relationship between the threshold voltage ($V_{th}$) roll-off (vertical axis: unit (mV)) and the gate length (horizontal axis: unit ($\mu$m)) in a semiconductor device acquired by the conventional fabrication process. The diagram shows how the $V_{th}$ roll-off varies according to the value of the gate length in case where the thickness of the SOI layer is 46 nm, 95 nm and 142 nm. In this example, the $V_{th}$ roll-off is the difference between the threshold voltage in case of the gate length of 10 $\mu$m and the threshold voltage at each gate length. As the SOI layer becomes thinner, the value of the $V_{th}$ roll-off when the gate length becomes short gets smaller. This makes it apparent that forming the SOI layer thinner is effective to suppress the SCE.

There are several semiconductor devices known which have an insulating layer provided under the channel region. For instance, it is proposed to form an insulating layer in contact with the source or drain region and in a region deeper than the channel region in order to prevent a punch-through current from being generated by shortening the channel length (see Japanese Patent Laid-Open No. 313865/1988).

It is also proposed to form an insulating layer or a semi-insulating layer in the Si substrate under the channel region in order to improve both the punch-through characteristic and sub threshold characteristic (Japanese Patent Laid-Open No. 211902/1995).

It is further proposed to form an insulating layer in the Si substrate between the source region and the drain region in order to suppress the occurrence of the punch-through phenomenon (Japanese Patent Laid-Open No. 51198/1996).

There has been proposed a method of forming a fully-depleted type transistor which suppresses an increase in the resistances of the source and drain regions and the extension layer by making the SOI layer thinner by forming a buried oxide film (BOX oxide film) on the SOI substrate in such a way that only that portion of the film which lies under the gate electrode is located at a shallow position (Japanese Patent Laid-Open No. 2001-135821).

In case of devices whose standby power consumption is desired to be lower, such as a semiconductor device for use in a portable terminal, making the off-leak current $I_{off}$ has a higher priority over increasing the operational speed. In such a transistor with a low off-leak current set ($I_{off}$<1E–11A/$\mu$m and threshold voltage of 0.4 V or so), making the SOI layer thinner to suppress the SCE brings about the following problems.

The following discusses a case of a fully-depleted type thin film SOI transistor. The "fully-depleted type" indicates that the SOI layer between the source and drain regions is fully depleted and generally the thickness of the SOI layer becomes about 50 nm or smaller.

The threshold voltage $V_{th}$ (V) can be expressed by the following equation 1 using a potential $\phi_F$ (V), an elementary electric charge q (C), a flatband voltage $V_{fb}$ (V), a body concentration $N_a$ (cm$^{-3}$) of the SOI layer, a thickness $T_{soi}$ (nm) of the SOI layer and an oxide film capacitance $C_{ox}$ (F).

$$V_{th}=V_{fb}+\phi_F+q\times N_a\times T_{soi}/C_{ox} \qquad (1)$$

The potential $\phi_F$ is the value that is acquired from $\phi_F=(E_F-E_i)/q$ where $E_F$ (eV) is the Fermi level and Ei (eV) is the Fermi level of an intrinsic semiconductor. The value of $2\times\phi_F$ is called a strong inversion potential and inversion occurs when the surface potential exceeds the value of $2\times\phi_F$. $V_{fb}$ is the value that is acquired from $V_{fb}=(W_m-W_s)-Q_{ox}/C_{ox}$ where $W_m$ is the gate electrode work function, $W_s$ is the silicon work function and $Q_{ox}$ is the interface charge density. The value of $(W_m-W_s)$ is called a work function difference.

In case of an NMOSFET formed on an SOI substrate with the conventional structure (also called an SOI-NMOSFET), for example, n$^+$ polysilicon ($W_m$: 4.15 V or so, $W_s$: about 4.7 V and the work function difference: -0.5 V or so) is used for the gate electrode.

Figure 11:
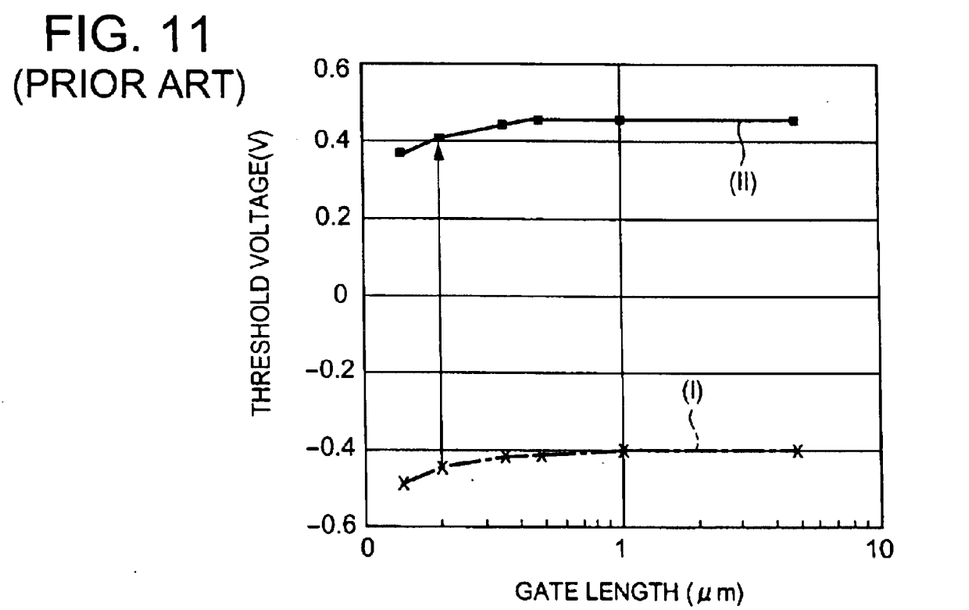
FIG. 11 is a diagram showing the relationship between the gate length and threshold voltage of the conventional semiconductor device.

FIG. 11 is a diagram showing the relationship between the gate length (vertical axis: unit (cm$^{-3}$)) of an SOI-NMOSFET with the conventional structure and the threshold voltage $V_{th}$ (horizontal axis: unit ($\mu$m)).

A curve (I) indicated by the one-dot chain line shows the case where an impurity is not doped in the SOI layer and a curve (II) indicated by the solid line shows the case where a p-type impurity is doped by an amount of 1E18 cm$^{-3}$ or so. It is apparent from the diagram that to adjust the threshold voltage to 0.4 V or so, the concentration of the p-type impurity or the body concentration Na of the SOI layer should be set to 1E18 cm$^{-3}$ or higher.

Figure 12:
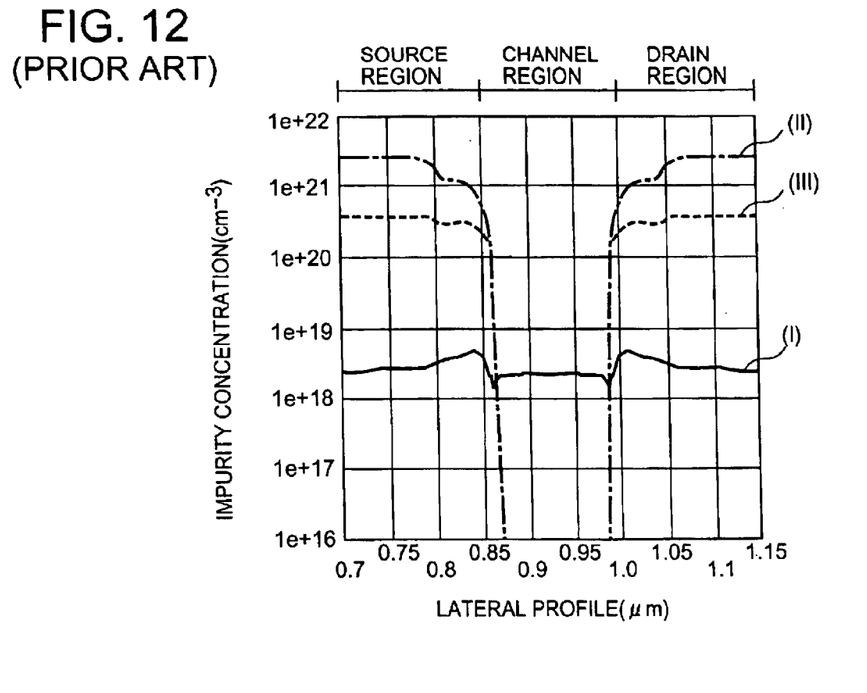
FIG. 12 is a diagram showing the relationship between the impurity concentration and lateral profile of the conventional semiconductor device.

FIG. 12 is a diagram showing the relationship between the lateral profile (horizontal axis: unit of an SOI-NMOSFET with the body concentration $N_a$ of the SOI layer set to 1E18 cm$^{-3}$ or higher and the impurity concentration (vertical axis: unit (cm$^{-3}$)). A curve (I) indicated by the solid line shows the concentration of boron. (B) which is a p-type impurity, a curve (II) indicated by the one-dot chain line shows the concentration of arsenic (As) which is an n-type impurity and a curve (III) indicated by the broken line shows the carrier concentration. It is apparent from the diagram that the concentration of the p-type impurity in the channel region is 2E18 cm$^{-3}$ or so which is considerably high.

In case where the body concentration of the SOI layer or the channel concentration exceeds 1E18 cm$^{-3}$, a reduction in the mobility of carriers (the electron mobility in the NMOSFET) becomes an issue. The reduction in the mobility leads to a reduction in the drive current of transistors.

Figure 13:
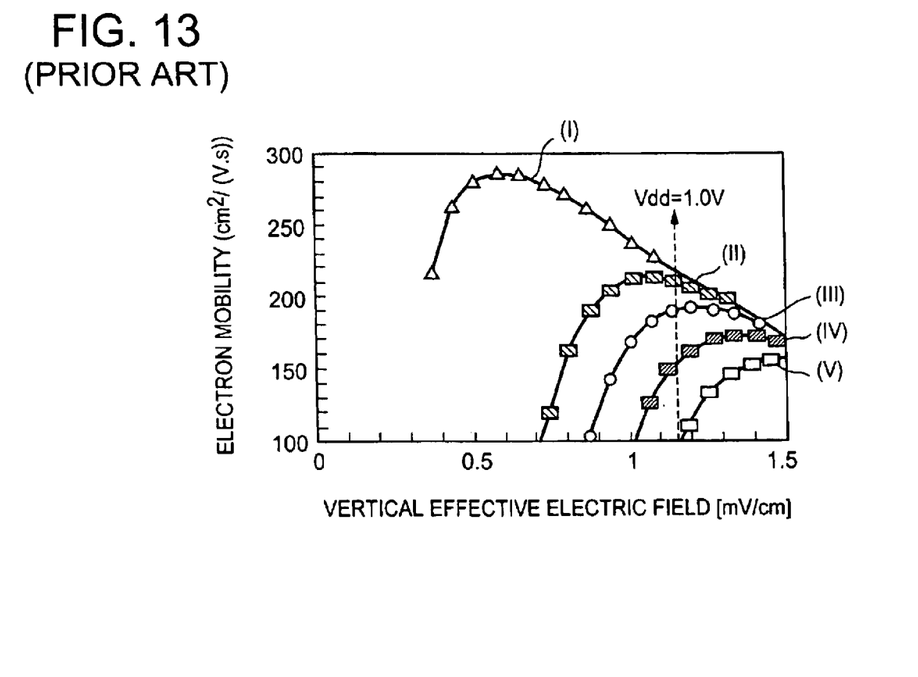
FIG. 13 is a diagram showing the relationship between the vertical effective electric field and electron mobility of the conventional semiconductor device.

FIG. 13 is a diagram showing the relationship between the electron mobility (vertical axis: unit (cm$^2$/(Vs))) and the vertical effective electric field (horizontal axis: unit (mV/cm)). Each of the graphs is called a mobility universal curve. The individual graphs indicated by (I) to (V) show the cases where the body concentration $N_a$ (unit: cm$^{-3}$) is 3×10$^{17}$ (I), 1.3×10$^{18}$ (II), 1.8×10$^{18}$ (III), 2.5×10$^{18}$ (IV) and 3.3×10$^{18}$ (V). The electron mobility becomes smaller as the body concentration gets higher. In FIG. 13, the value of the vertical effective electric field indicated by the broken-line arrow is equivalent to the case where the applied gate voltage is set to 1.0 V. It is apparent that as the body concentration $N_a$ becomes higher, the electron mobility drops considerably. Therefore, increasing the impurity concentration of the SOI layer lowers the electron mobility, resulting in a reduction in the drive current of the transistors or the transistor drive power.

As described above, the MOSFET whose off-leak current is set small and which is formed on the SOI substrate requires that the channel concentration should be increased as the transistor size becomes smaller and the film thickness becomes thinner. The increase in channel concentration however brings about a problem of lowering the transistor drive power.

SUMMARY OF THE INVENTION

To overcome the above-described problems, a semiconductor device according to the present invention has the following structure. The semiconductor device, which has an SOI (Silicon On Insulator) layer of a first conductivity type on an SOI substrate, a source region and a drain region of a second conductivity type provided on the SOI layer with a channel region in between, a gate insulating film formed above the SOI layer and a gate electrode formed above the gate insulating film, comprises:

a buried insulating film formed in that region of the SOI layer which lies between the source region and the drain region and under the gate insulating film; and a non-doped silicon film formed between the buried insulating film and the gate insulating film in contact with a top surface of the buried insulating film and serving as a channel region.

The SOI substrate has a BOX layer or a silicon oxide film and an SOI layer or a silicon film laminated on a silicon substrate in order.

DETAILED DESCRIPTION OF THE INVENTION

The best mode for working out the invention will be described below referring to the accompanying drawings. The individual diagrams for explaining fabrication methods schematically illustrate cross sections of structures that are acquired in the individual stages in the fabrication process. The sizes, shapes and layout relationship of the individual structural elements constituting the structure are shown schematically enough for readers to understand the invention. To avoid the redundant description, like or same reference numerals are given to identical or corresponding structural elements in the individual diagrams.

The following discusses an NMOSFET as one example; therefore, p-type is the first conductivity type and n-type is the second conductivity type.

<First Embodiment>

Figure 1:
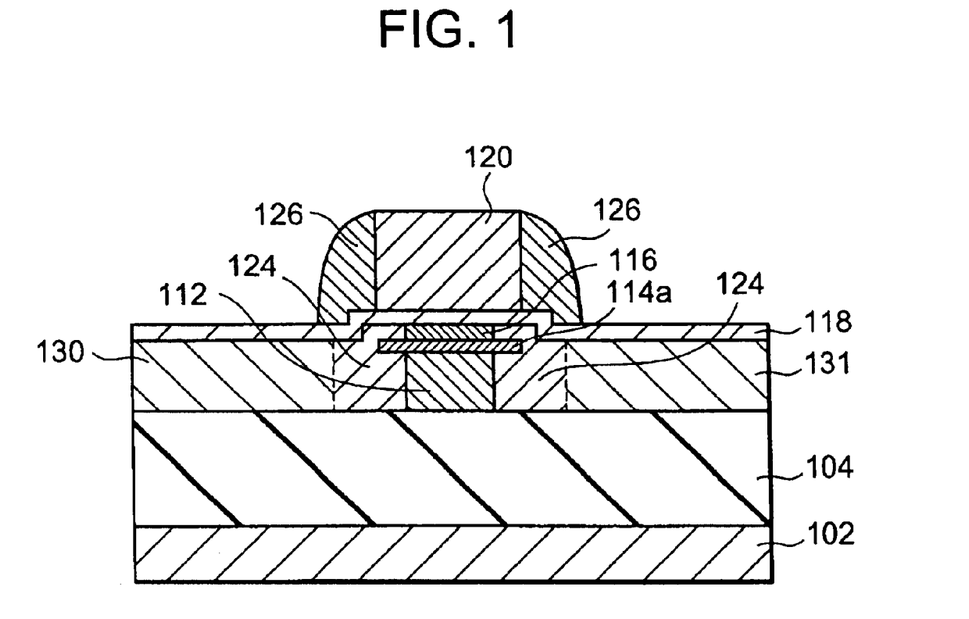
FIG. 1 is a diagram illustrating a cross section for explaining an example of the structure of a semiconductor device according to a first embodiment of the invention.

FIG. 1 is a schematic cross-sectional view illustrating a semiconductor device according to the first embodiment of the invention. The following discusses a semiconductor device with a structure exemplified in FIG. 1.

A BOX layer 104 which is a buried silicon oxide film is deposited on an Si substrate 102. An SOI layer 112 is formed on the BOX layer 104. A source region 130 and a drain region 131, which are n-type impurity diffusion layers, are provided in the SOI layer 112, apart from each other with a channel region in between. A gate electrode 120 is formed above the SOI layer 112 located between the source region 130 and the drain region 131 via a gate oxide film 118 which is a gate insulating film. Two LDD regions 124 as low-concentration regions are formed in the SOI layer on the channel region side, in contact with the source region 130 and the drain region 131 respectively and apart from each other. Sidewalls 126 are formed on the sides of the gate electrode 120. A buried insulating film 114a is formed in that region of the SOI layer between the source region 130 and the drain region 131 which lies under the gate oxide film 118. The buried insulating film 114a is formed in such a way as not to contact the BOX layer 104. The buried insulating film 114a is formed by a silicon oxide film. The preferable width of the buried insulating film 114a in the direction of the channel length is equal to the channel length.

The buried insulating film 114a may be buried in the LDD region 124 to a depth of about 10 to 20 nm. A non-doped silicon film 116 is formed in that region of the SOI layer 112 which lies between the buried insulating film 114a and the gate oxide film 118. The non-doped silicon film 116 is provided in contact with the top surface of the buried insulating film 114a and serves as a channel region. The concentration of the p-type impurity (also called "body concentration") in that region of the SOI layer 112 which lies under the buried insulating film 114a is $10^{18}$ cm$^{-3}$ or higher.

As apparent from the above, the semiconductor device according to the first embodiment differs from the structure of the conventional semiconductor device in that the buried insulating film 114a is formed between the source and drain regions under the channel region, the non-doped silicon film 116 is formed between the buried insulating film 114a and the gate oxide film 118 and that region of the SOI layer 112 which lies under the buried insulating film 114a is formed to have a high body concentration. The SOI layer 112 with a high body concentration prevents the SCE (Short Channel Effect) and the non-doped silicon film 116 is formed in the channel region where electrons move, thus preventing the electron mobility from being lowered by the impurity. This can suppress a reduction in drive current more than the prior art.

Referring to FIGS. 2A to 4C, a method of fabricating the semiconductor device according to the first embodiment will be described below.

Figure 2A:
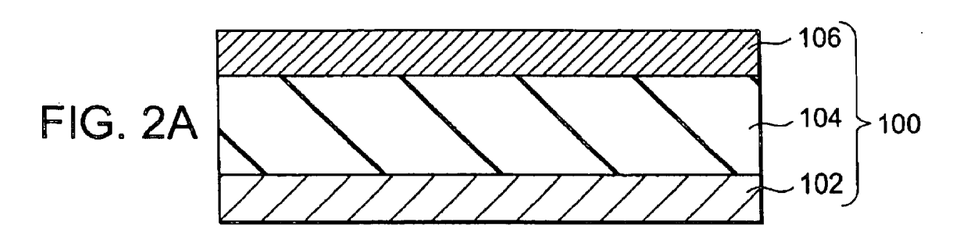
FIGS. 2A to 2D are process diagrams for explaining a method of fabricating the semiconductor device according to the first embodiment.

First, a SOI substrate 100 is prepared. The. Si substrate 102; the BOX layer 104 and an SOI layer 106 are deposited in order on the SOI substrate 100 (FIG. 2A). The thickness of the SOI layer is adjusted to the desired thickness by thickness-controlled oxidation (formation and removal of a sacrificed oxidation film). The SOI substrate 100 in use has, for example, the BOX layer whose thickness is 100 to 200 nm and the SOI layer 106 whose thickness is adjusted to 30 to 50 nm.

Figure 2B:
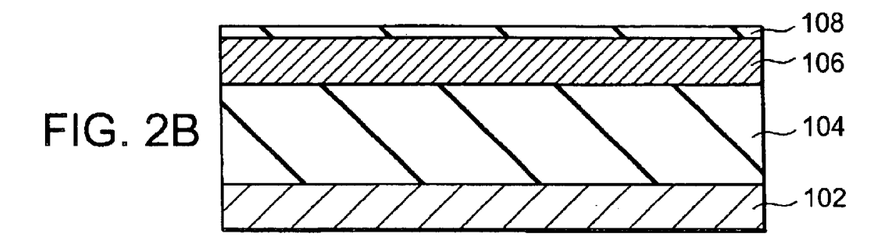

An oxide film 108 is deposited about 10 nm thick on the top surface of the SOI layer 106 by, for example, thermal oxidation. The oxide film 108 is deposited to prevent the SOI layer from being damaged by injection of threshold-controlled ions (FIG. 2B).

Figure 2C:
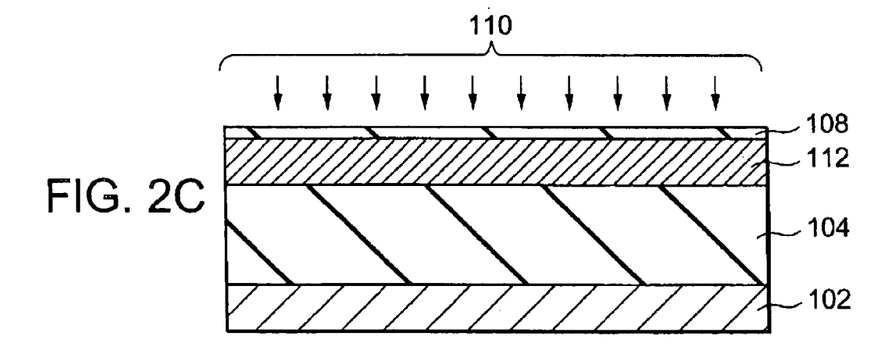
Figure 2D:
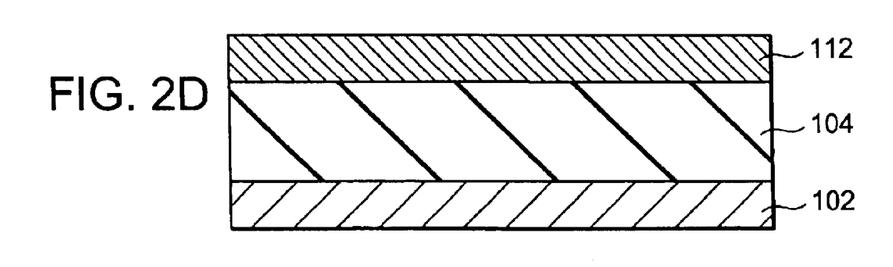

Next, threshold-controlled ions 110 are injected into the SOI layer 106 via the oxide film 108, thereby forming the SOI layer 112. Here, the impurity concentration (also called "body concentration") in the SOI layer 112 is made to be $10^{18}$ cm$^{-3}$ or higher by injecting, for example, BF2 ions which are a p-type impurity by injection energy of 15 keV and a dose of 1E13 cm$^{-2}$ or so (FIG. 2C). Then, the oxide film 108 is removed (FIG. 2D).

The process up to setting of the body concentration of the SOI layer to $10^{18}$ cm$^{-3}$ or higher is one example and any well-known method may be employed to form the SOI layer on the SOI substrate as long as the body concentration exceeds $10^{18}$ cm$^{-3}$.

Figure 3A:
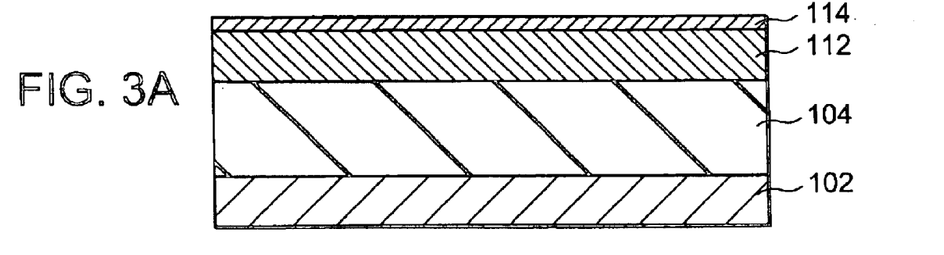
FIGS. 3A to 3C are process diagrams following the step in FIG. 2D.
Figure 3B:
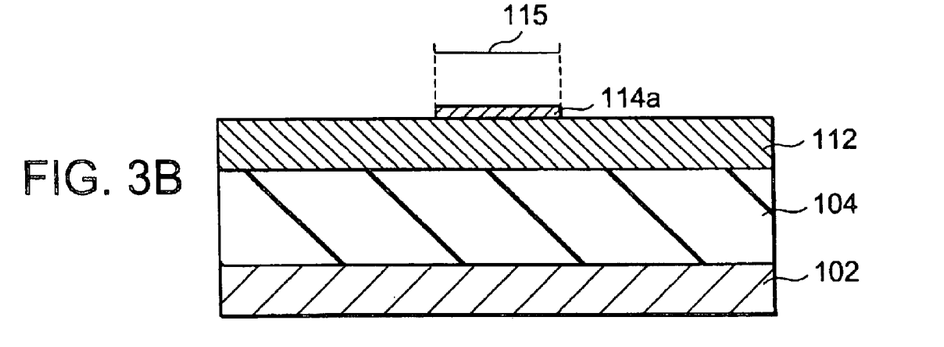

Next, an oxide film 114 is deposited about 10 nm thick by thermal oxidation or CVD, for example (FIG. 3A). The oxide film 114 is patterned by a known photolithography etching technique to form the buried insulating film 114a. The buried insulating film 114a is patterned in lands in such a way as to remain on a gate-electrode forming region 115 as seen in a planar view (FIG. 3B). Such patterning can finally form the buried insulating film 114a directly under the channel region. The formation range of the buried insulating film 114a in the direction of the gate length should be the same as the formation range of the gate electrode or a range which overlaps the LDD region (to be formed later) by about 10 to 20 nm.

Figure 3C:
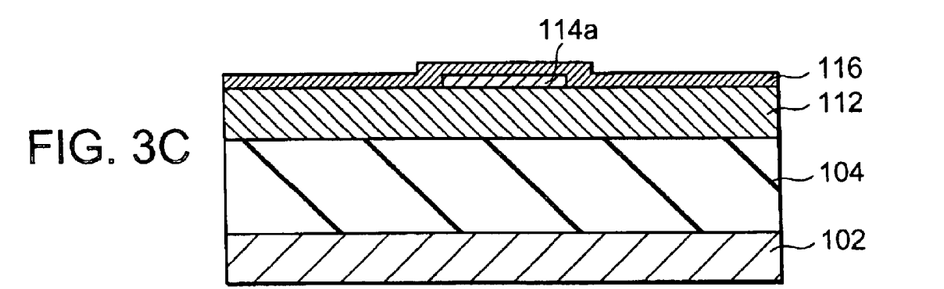

Then, the non-doped silicon film 116 is deposited 5 to 10 nm thick on the SOI layer 112 including the buried insulating film 114a by epitaxial growth (FIG. 3C).

Next, the gate oxide film 118 is formed about 2 to 5 nm thick on the non-doped silicon film 116 by, for example, thermal oxidation.

Figure 4A:
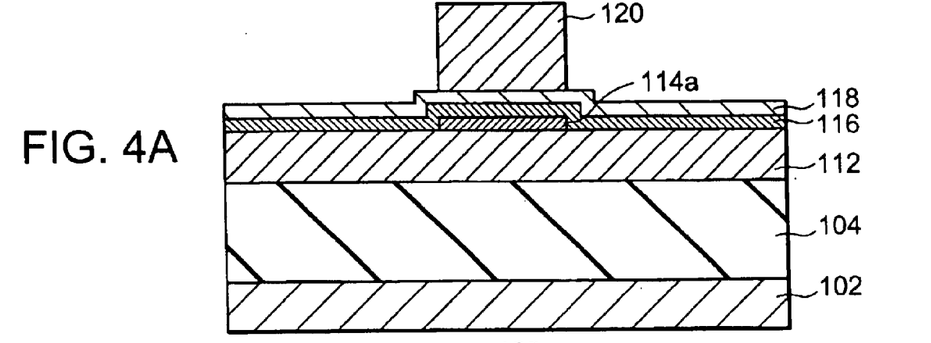
FIGS. 4A to 4C are process diagrams following the step in FIG. 3C.

Further, a polysilicon film is deposited about 200 nm thick on the gate oxide film 118 by CVD. Next, the pattern of the gate electrode is subjected to the known photolithography etching technique to form the gate electrode 120 (FIG. 4A).

Figure 4B:
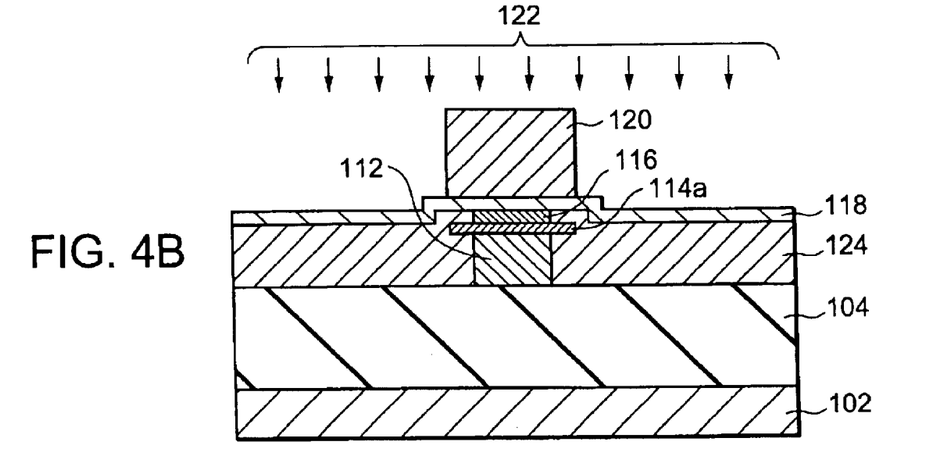

Then, n-type impurity ions 122 are injected in such a way as to have a lower concentration than that of the source and drain regions which are to be formed later, thereby forming LDD regions. For example, with the gate electrode 120 as a mask, arsenic (As) ions or phosphorus (P) ions are injected into the SOI layer 112 and the non-doped silicon film 116 via the gate oxide film 118 by injection energy of 10 keV or so and a dose of 5E13 cm$^{-2}$ or so, thereby forming LDD regions 124 (FIG. 4B).

Figure 4C:
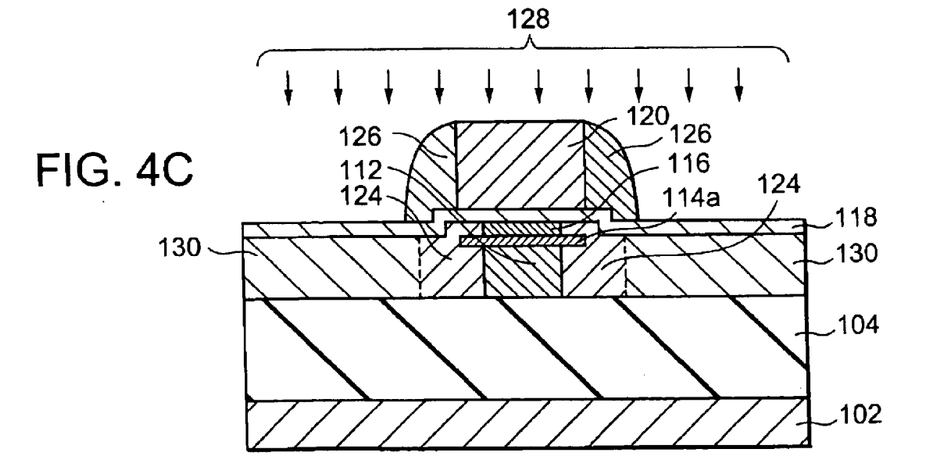

A silicon oxide film is deposited about 100 nm thick by CVD and subjected to anisotropic etching to form the sidewalls 126. Impurity ions 128 are injected to form the source region 130 and the drain region 131. For example, with the gate electrode 120 and the sidewalls 126 as masks, As or p ions are injected in the LDD regions 124 by injection energy of 10 keV or so and a dose of 5E13 cm$^{-2}$ or so. At this time, As or P ions are doped in the gate electrode 120 as an n-type impurity (FIG. 4C).

To activate the source and drain regions, RTA (Rapid Thermal Anneal) is carried out. For example, RTA is performed at 1000° C. for ten seconds or less. Thereafter, silicide is formed on the top surfaces of the source and drain regions and the gate electrode as done in the conventional fabrication process, and deposition of the interlayer insulating film, formation of contacts and other necessary steps are performed after which wires are formed to form an NMOSFET (not shown).

Figure 5A:
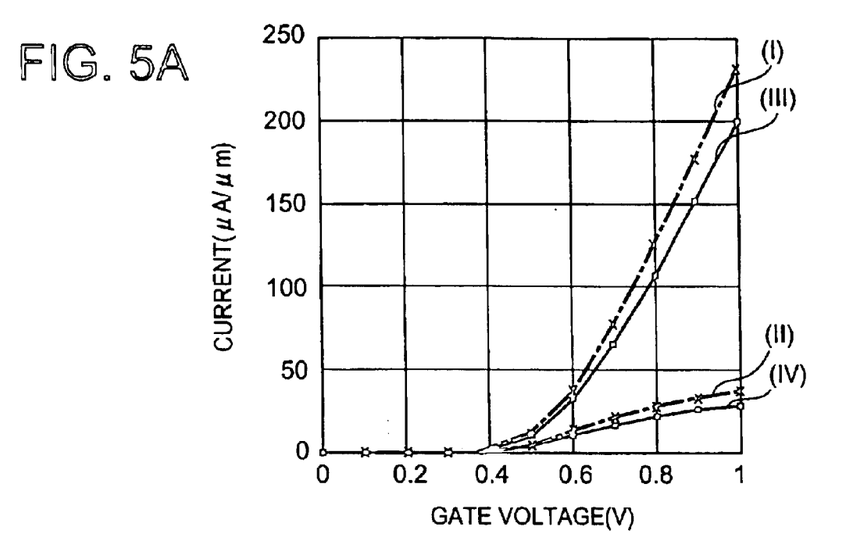
FIGS. 5A and 5B are diagrams for explaining the relationship between the current and voltage of the semiconductor device according to the first embodiment.
Figure 5B:
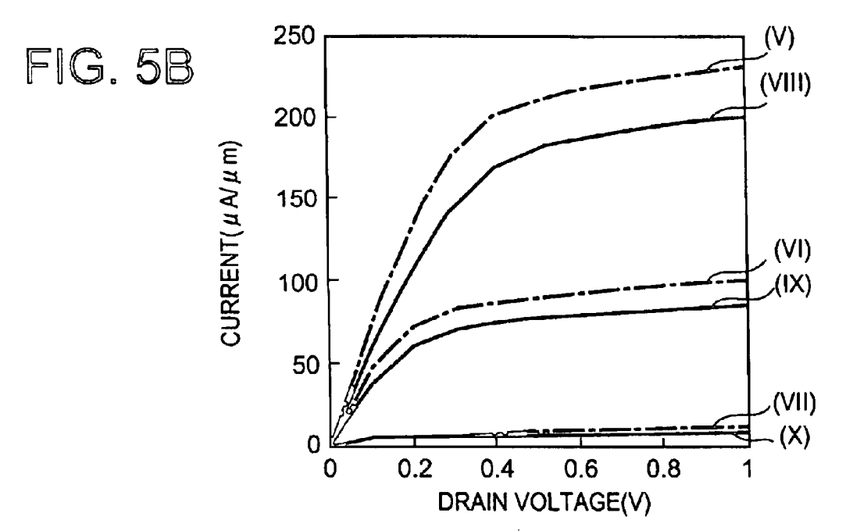

FIGS. 5A and 5B are diagrams showing the transistor characteristics of the semiconductor device according to the first embodiment.

Figure 14:
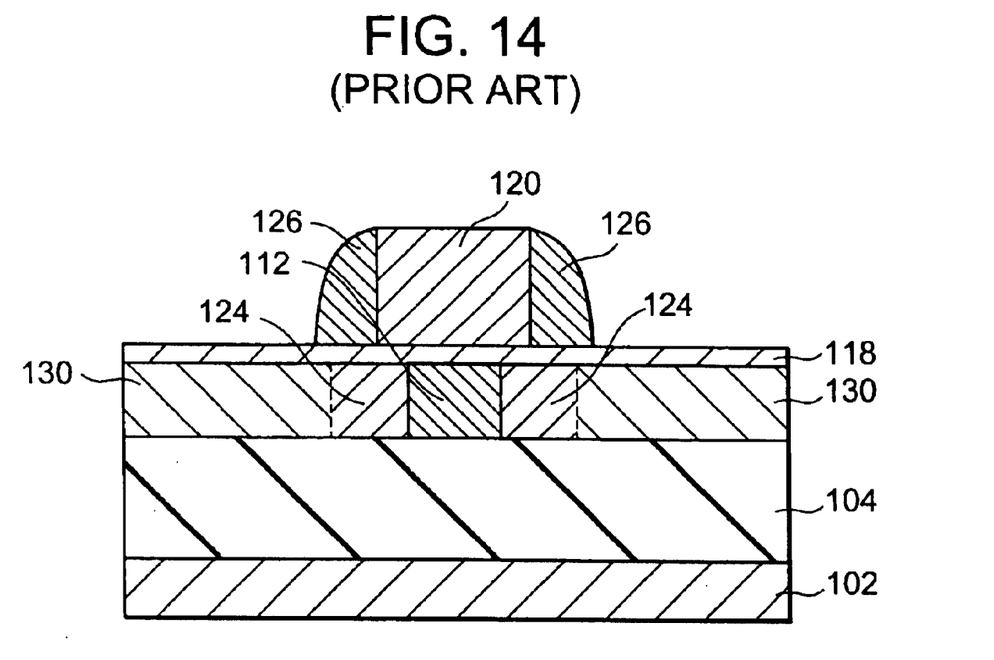
FIG. 14 is a diagram illustrating a cross section used for explaining the structure of the conventional semiconductor device.

In the diagrams, the transistor characteristics of the NMOSFET according to the first embodiment whose threshold voltage $V_{th}$ is set to 0.4 V are compared with those of the conventional NMOSFET using TCAD (Technology Computer Aided Design) simulation. The conventional NMOSFET does not have the buried insulating film 114a and the non-doped silicon film 116 of the semiconductor device according to the first embodiment as shown in FIG. 14.

FIG. 5A is a diagram for explaining the relationship between the gate voltage (horizontal axis: unit (V)) and the drain current (vertical axis: unit ($\mu A/\mu m$)). (I) and (II) in the four graphs (I) to (IV) show NMOSFETs according to the first embodiment, (I) showing the case where the drain voltage is 50 mV while (II) shows the case where the drain voltage is 1.0 V. (III) and (IV) show the conventional NMOSFETs, (III) showing the case where the drain voltage is 50 mV while (IV) shows the case where the drain voltage is 1.0 V. It is apparent that for both drain voltages of 50 mV and 1.0 V, the NMOSFETs according to the first embodiment have larger drain currents than the conventional NMOSFETs.

In the case where the drain voltage is 1.0 V and the gate voltage is 1.0 V, for example, the drain current of the conventional NMOSFETs is 200 ($\mu A/\mu m$) whereas the drain current of the NMOSFETs according to the first embodiment is 230 ($\mu A/\mu m$), 30 ($\mu A/\mu m$) or so higher than that of the prior art. Likewise, in the case where the drain voltage is 50 mV and the gate voltage is 1.0 V, the drain current of the conventional NMOSFETs is 29 ($\mu A/\mu m$) whereas the drain current of the NMOSFETs according to the first embodiment is 37 ($\mu A/\mu m$), 8 ($\mu A/\mu m$) or so higher than that of the prior art.

FIG. 5B is a diagram for explaining the relationship between the drain voltage (horizontal axis: unit (V)) and the drain current (vertical axis: unit ($\mu A/\mu m$)). Graphs (V), (VI) and (VII) show NMOSFETs according to the first embodiment in the case where the gate voltage is 1.0 V, the case where the gate voltage is 0.75 V and the case where the gate voltage is 0.5 V, respectively. Graphs (VIII), (IX) and (X) show the conventional NMOSFETs in the case where the gate voltage is 1.0 V, the case where the gate voltage is 0.75 V and the case where the gate voltage is 0.5 V, respectively. It is apparent that for any of the gate voltages, the NMOSFETs according to the first embodiment have larger drain currents than the conventional NMOSFETs.

According to the semiconductor device of the first embodiment, as apparent from the above, the SCE is suppressed by increasing the body concentration in that region of the SOI layer which lies under the buried insulating film 114a and the non-doped silicon film 116 which serves as a channel region is formed in the channel region above the buried insulating film 114a where electrons travel, so that the impurity concentration is extremely low. This can prevent a reduction in the inversion layer mobility even in a transistor whose off-leak current is set low, so that the drive current can be improved as compared with that of the conventional semiconductor device.

<Modification of First Embodiment>

Figure 6:
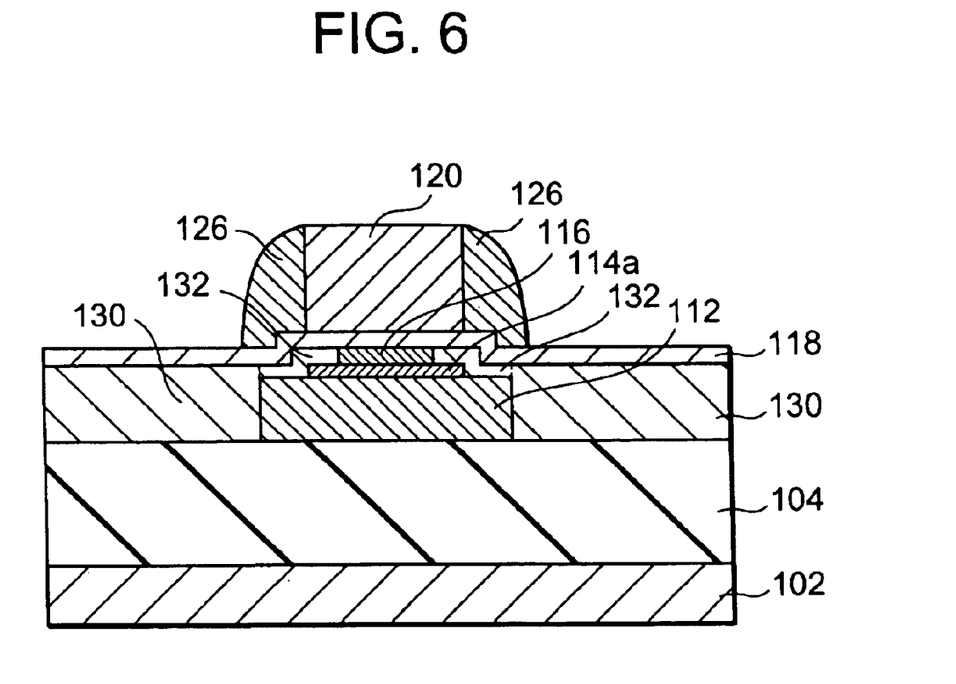
FIG. 6 is a diagram illustrating a cross section used for explaining a modification the semiconductor device according to the first embodiment.

Although the foregoing description of the first embodiment has been given of an example where LDD regions are formed, extension layers may be formed instead of the LDD regions. FIG. 6 illustrates an example of the structure of an NMOSFET in case where extension layers 132 are formed. Two extension layers 132 are formed on the SOI layer 112 in place of the LDD regions 124 in FIG. 1. The extension layers 132 are formed on the surface-side region of the SOI layer between the source region 130 and the drain region 131 in such a way as not to contact the BOX layer 104. The impurity concentration of the extension layers 132 is about the same as the impurity concentration of the source and drain regions.

In case of forming an NMOSFET having extension layers, an n-type impurity should be ion-injected in that shallow region of the SOI layer which is close to the surface of the gate insulating film 118 by, for example, injection energy of 10 keV or so and a dose of 1E15 cm$^{-2}$ or so in place of the ion injection step for forming the LDD regions in the fabrication method for a semiconductor device according to the first embodiment. In case where the value of the supply voltage in use is small, it is not necessary to consider the relaxation of the resistances of the junction regions between the SOI layer whose body concentration is high and the source region and the drain region 131. In this case, therefore, it is better to provide the extension layers instead of the LDD regions.

<Second Embodiment>

In the semiconductor device according to the first embodiment, either the LDD regions or the extension regions are formed. The semiconductor device according to the second embodiment is provided with both the LDD regions and the extension regions.

Figure 7:
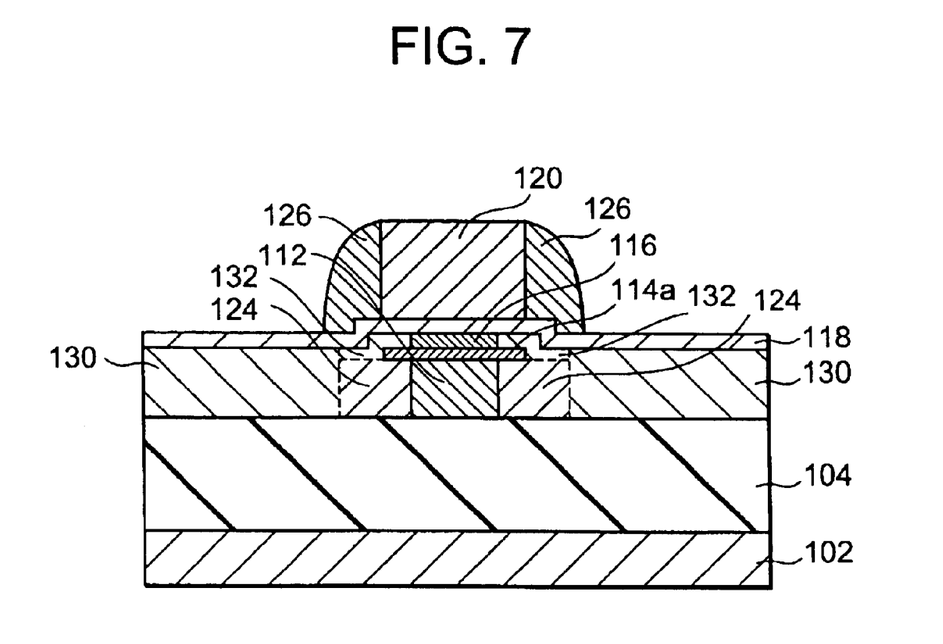
FIG. 7 is a diagram illustrating a cross section for explaining an example of the structure of a semiconductor device according to a second embodiment of the invention.

FIG. 7 is a schematic cross-sectional view illustrating an example of the structure of the semiconductor device according to the second embodiment.

Both the LDD regions 124 formed in the semiconductor device according to the first embodiment and the extension layers 132 formed in the semiconductor device according to the modification of the first embodiment are formed in the semiconductor device according to the second embodiment. The extension layers 132 are formed between the LDD regions 124 and the gate insulating film 118.

The following discusses a fabrication method for the semiconductor device according to the second embodiment.

Figure 8A:
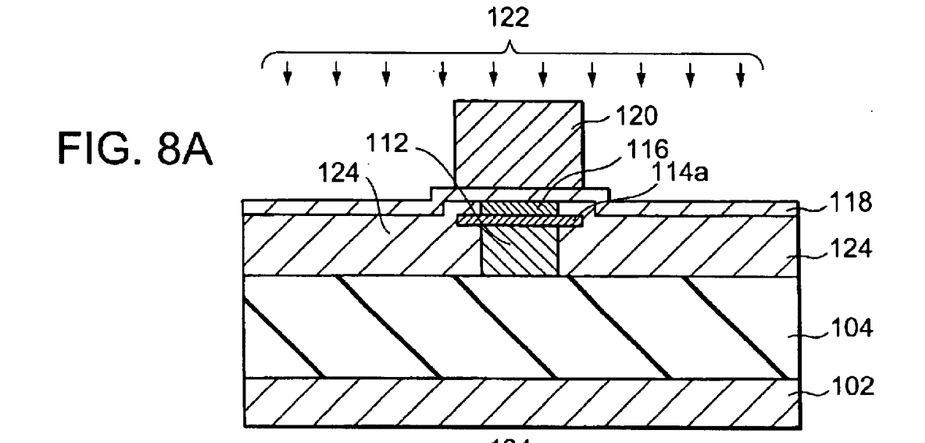
FIGS. 8A to 8C are partial process diagrams for explaining a method of fabricating the semiconductor device according to the second embodiment.
Figure 8B:
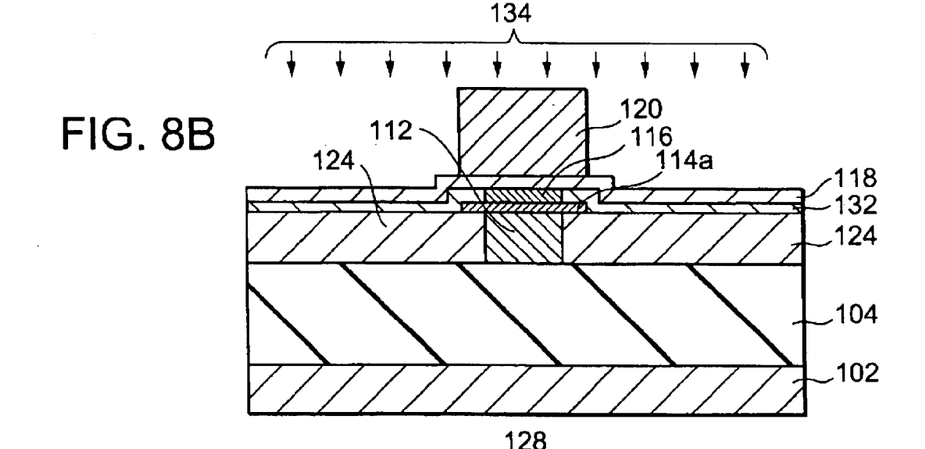

The process up to the formation of the LDD regions 124 which are low-concentration regions (equivalent to FIG. 4B) is carried out by the same method as the fabrication method for the semiconductor device according to the first embodiment (FIG. 8A).

n-type impurity ions 134 are injected into the shallow surface region of the SOI substrate to form the extension layers 132. For example, with the gate electrode 120 as a mask, arsenic (As) ions are injected in the SOI layer 112 by injection energy of 5 keV and a dose of 1E15 cm$^{-2}$ or so via the gate oxide film 118 to form the extension layers 132, thus yielding a structure as shown in FIG. 8B. In this case, the extension layers 132 are formed in the surface regions of the LDD regions 124.

Figure 8C:
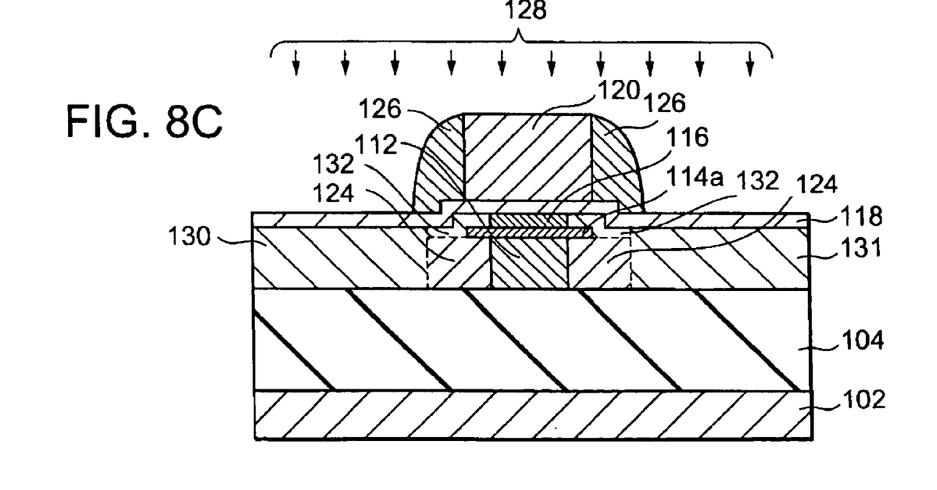

Next, a silicon oxide film is deposited about 100 nm thick on the structure in FIG. 8B by CVD and subjected to anisotropic etching to form the sidewalls 126. Then, the impurity ions 128 are injected to form the source region 130 and the drain region 131. For example, with the gate electrode 120 and the sidewalls 126 used as masks, As or p tons are injected in the LDD regions 124 by injection energy of 10 keV or so and a dose of 5E13 cm$^{-2}$ or so, thereby forming the source region 130, and the drain region 131. At this time, As or P ions are doped in the gate electrode 120 as an n-type impurity (FIG. 8C). An NMOSFET having both the extension layers 132 and LDD regions 124 is formed in this manner.

Because the semiconductor device according to the second embodiment, like the semiconductor device according to the first embodiment, has a low impurity concentration in the channel region where electrons travel, a reduction in inversion layer mobility is small. As the concentrations of the junction regions between the SOI layer whose body concentration is high and the source region and the drain region are relaxed by the LDD regions, the rebonding current is suppressed, thus suppressing the off-leak current. As the electric field in the junction regions is relaxed, the source and drain durability is improved.

Although the foregoing description of the embodiments has been given of an NMOSFET, the invention can also be adapted to a PMOSFET by reversing the conductivity types.

According to the semiconductor device of the invention, the SCE is suppressed by providing the region of an SOI layer with a high impurity concentration (body concentration) under the buried insulating film formed in the SOI layer between the source and drain regions and the impurity concentration in the region where electrons travel can be lowered to increase the electron mobility by providing the non-doped silicon film in that region of the SOI layer which lies above the buried insulating film. This makes it possible to set the off-leak current small and suppress lowering of the transistor drive power which is originated from an increase in the channel concentration caused by the miniaturization of an MOSFET formed on the SOI substrate and reduction in film thickness.

What is claimed is:

1. A semiconductor device having an SOI (Silicon On Insulator) layer of a first conductivity type on an SOI substrate, a source region and a drain region of a second conductivity type provided on said SOI layer with a channel region in between, a gate insulating film formed above said SOI layer and a gate electrode formed above said gate insulating film, further comprising:
    a buried insulating film formed in that region of said SOI layer which lies between said source region and said drain region and under said gate insulating film; and
    a non-doped silicon film formed between said buried insulating film and said gate insulating film in contact with a top surface of said buried insulating film and serving as a channel region.

2. The semiconductor device according to claim 1, having two low-concentration regions which are formed in contact with said source region and said drain region respectively and apart from one another on the channel region side and a concentration of whose impurity of said second conductivity type is lower than that of an impurity of said source region and said drain region.

3. The semiconductor device according to claim 1, having two extension regions which are formed in contact with said source region and said drain region respectively and apart from one another on the channel region side and a concentration of whose impurity of said second conductivity type is equal to that of an impurity of said source region and said drain region.

4. The semiconductor device according to claim 1, having:
    two low-concentration regions which are formed in contact with said source region and said drain region on the channel region side and a concentration of whose impurity of said second conductivity type is lower than that of an impurity of said source region and said drain region; and
    two extension regions which are formed in contact with said source region and said drain region on the channel region side and a concentration of whose impurity of said second conductivity type is equal to that of an impurity of said source region and said drain region.

5. The semiconductor device according to claim 1, wherein an impurity concentration of that region of said SOI layer which lies under said buried insulating film is equal to or greater than $1 \times 10^{18}$ cm$^{-3}$.

* * * * *